US006589656B2

(12) United States Patent
Maekawa et al.

(10) Patent No.: US 6,589,656 B2
(45) Date of Patent: Jul. 8, 2003

(54) EPOXY RESIN COMPOSITION, PREPREG AND METAL-CLAD LAMINATE

(75) Inventors: Tetsuya Maekawa, Osaka (JP); Takao Hayashi, Moriguchi (JP); Takeshi Yoshimura, Kadoma (JP); Eiichiro Saito, Moriguchi (JP); Kiyotaka Komori, Kouriyama (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 09/911,545

(22) Filed: Jul. 25, 2001

(65) Prior Publication Data

US 2002/0049264 A1 Apr. 25, 2002

(30) Foreign Application Priority Data

Jul. 26, 2000 (JP) ........................................ 2000-224994

(51) Int. Cl.[7] ........................... B32B 15/08; B32B 27/38
(52) U.S. Cl. ..................... 428/418; 523/466; 525/391; 525/396; 525/523
(58) Field of Search ................ 523/466; 525/391, 525/396, 523; 428/418

(56) References Cited

U.S. PATENT DOCUMENTS

| | | | |
|---|---|---|---|
| 4,521,584 A | 6/1985 | Heitz et al. | |
| 5,089,343 A | 2/1992 | Colborn et al. | |
| 5,880,221 A | 3/1999 | Liska et al. | |

FOREIGN PATENT DOCUMENTS

| | | |
|---|---|---|
| EP | 0962495 | 12/1999 |
| JP | 6-17457 | 9/1994 |
| JP | 9-291148 | 11/1997 |

OTHER PUBLICATIONS

Brains, el. *Epoxy Resin Technology*, Interscience, pp. 45–48, 51 & pp. 52, 63 and 64, 1968.*
Database WPI, Section Ch, Week 199729, Derwent Publications Ltd.; London, GB; XP002180183.
English Language Abstract of JP 10101772.
English Language Abstract of JP 10265552.

* cited by examiner

Primary Examiner—Robert Dawson
Assistant Examiner—D. Aylward
(74) Attorney, Agent, or Firm—Greenblum & Bernstein, P.L.C.

(57) ABSTRACT

An epoxy resin composition of the invention comprises: an epoxy resin; a hardening agent; and a phenol-modified polyphenylene oxide having a number average molecular weight of 1000 to 4000, which is prepared by carried out a redistribution reaction between a polyphenylene oxide and a phenol compound in the presence of a reaction initiator which can be decomposed to generate an alcohol, a prepreg and a metal-clad laminate of the invention contain the epoxy resin composition.

13 Claims, No Drawings

EPOXY RESIN COMPOSITION, PREPREG AND METAL-CLAD LAMINATE

BACKGROUND OF THE INVENTION

1. Field of the Invention

This invention relates to an epoxy resin composition comprising an epoxy resin, phenol-modified polyphenylene oxide obtained by redistribution reaction between a polyphenylene oxide and a phenol compound in the presence of a reaction initiator, and a hardening agent and, more specifically, an epoxy resin composition to be used as a material for preparing metal-clad laminates such as printed wiring boards, prepreg and metal-clad laminate using the composition

2. Description of Background Information.

As materials for preparing insulating boards such as printed wiring boards, epoxy resin compositions have popularly been used. With the increase in integration degree of electronic parts such as semi-conductors, there have been known, as materials for insulating boards having excellent high frequency properties such as excellent dielectric constant and a high glass transition temperature, epoxy resin compositions containing an epoxy resin, phenol-modified polyphenylene oxide having a number average molecular weight of 1000 to 3000 prepared by redistribution reaction between polyphenylene oxide and a phenol compound in the presence of a reaction initiator, and a hardening agent by, for example, Japanese Patent Laid-Open No. 291148/1997. The phenol-modified polyphenylene oxide is obtained by subjecting a high molecular polyphenylene oxide having a number average molecular weight of 10000 to 30000 to redistribution reaction to reduce the number average molecular weight to 1000 to 3000.

Such redistribution reaction sometimes generates a less reactive modified polyphenylene oxide by the reaction with a reaction initiator. Presence of such less reactive modified polyphenylene oxide may cause fluctuation in quality of products manufactured therefrom. Thus, it has been desired to improve a reactivity of the epoxy resin composition.

In addition, with a recent increasing demand for miniaturization, printed wiring boards in which the above-described epoxy resin composition is used have increasingly been made multi-layer. In manufacturing multi-layer printed wiring boards, there have been required materials having a better glass transition temperature or materials having a lower expansion coefficient since they are to be heat-treated.

This application is based on a Japanese Patent Applications 2000-224994 filed on Jul. 26, 2000, herein cooperated by reference.

SUMMARY OF THE INVENTION

This invention is made with the above-described circumstances in mind, and provides an epoxy resin composition comprising an epoxy resin, phenol-modified polyphenylene oxide, and a hardening agent, which shows a higher reactivity at a hardening reaction, a prepreg and metal-clad laminate using this epoxy resin composition.

Furthermore, the invention provides an epoxy resin composition capable of providing a metal-clad laminate having an excellent glass transition temperature.

Still further, the invention provides an epoxy resin composition capable of providing a metal-clad laminate having a lower expansion coefficient.

Yet further, the invention provides an epoxy resin composition capable of providing a metal-clad laminate which can attain a lower dielectric constant and a lower dielectric loss tangent.

As a result of intensive investigations to attain the objects of the invention, the inventors have found that the reactivity of an epoxy resin composition can be improved by using specific reaction initiators such as compounds represented by the formula (1), (2) or (3) and that an metal-clad laminate prepared from the epoxy resin composition containing as a constituent a phenol-modified polyphenylene oxide obtained by using the reaction initiator, has an excellent glass transition temperature and shows a lower expansion coefficient and lower dielectric properties, thus having completed the invention based on the findings. Also, as a result of further investigations, the inventors have found that phenol-modified polyphenylene oxides obtained by redistribution reaction in the presence of a particular reaction initiator such as compounds represented by the formula of (1), (2) or (3) and having a number average molecular weight of 4000 or less, do not cause deterioration of performance of printed wiring boards prepared from them, thus having completed the invention based on the finding.

Additionally, a number average molecular weight of the phenol-modified polyphenylene oxide as used herein means a molecular weight determined by measuring molecular weight distribution using gel permeation chromatography.

The present invention includes the following.

(1) An epoxy resin composition comprising:

an epoxy resin;

a hardening agent; and, a phenol-modified polyphenylene oxide having a number average molecular weight of 1000 to 4000, which is prepared by carrying out a redistribution reaction between a polyphenylene oxide and a phenol compound in the presence of a reaction initiator which can be decomposed to generate an alcohol.

(2) The epoxy resin composition as described in the item (1), wherein the alcohol is an aliphatic alcohol.

(3) The epoxy resin composition as described in the item (1) or (2), wherein the alcohol has a boiling point of 150° C. or less.

(4) The epoxy resin composition as described in any one of the item (1) to (3), wherein the reaction initiator is a compound represented by formula (1):

wherein R and R', which are the same or different, each represents an alkyl group.

(5) The epoxy resin composition as described in any one of the item (1) to (3), wherein the reaction initiator is a compound represented by formula (2):

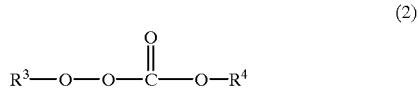

wherein $R^3$ and $R^4$, which are the same or different, each represents an alkyl group.

(6) The epoxy resin composition as described in the item (5), wherein the reaction initiator represented by the formula (2) is t-butyl peroxy isopropyl monocarbonate.

(7) The epoxy resin composition as described in any one of the item (1) to (3), wherein the reaction initiator is a compound represented by formula (3):

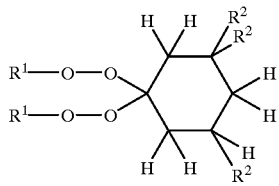

(3)

wherein R¹ represents an alkyl group, R² represents CH₃ or H.

(8) The epoxy resin composition as described in any one of the item (1) to (7), wherein the redistribution reaction is carried out in the presence of a catalyst together with the reaction initiator.

(9) The epoxy resin composition as described in the item (8), wherein the catalyst is cobalt naphthenate.

(10) The epoxy resin composition as described in claim (8), wherein the catalyst is compounded in an amount of 0.001 to 0.01. part by weight per 100 parts by weight of the polyphenylene oxide.

(11) A prepreg prepared by: impregnating a substrate with an epoxy resin composition described in any one of the item (1) to (10); and semi-hardening the epoxy resin composition.

(12) A metal-clad laminate comprising a metal foil and a prepreg described in the item (11), in which the epoxy resin composition is hardened.

(13) The metal-clad laminate described in item (12), wherein the epoxy resin composition in the prepreg is hardened by heat-pressing after the prepreg and the metal foil are superposed.

Since the phenol-modified polyphenylene oxide is prepared by using the above-described reaction initiator, there remain less unreacted materials. Hence, the metal-clad laminate has an excellent glass transition temperature and shows a lower expansion coefficient, a lower dielectric constant and a lower dielectric loss tangent.

DETAILED DESCRIPTION OF THE INVENTION

The first embodiment of the epoxy resin composition of the invention is described below.

The epoxy resin composition comprises an epoxy resin, a phenol-modified polyphenylene oxide (a polyphenylene oxide that have been modified with a phenol compound) having a number average molecular weight of 1000 to 4000, which is obtained by carrying out a redistribution reaction between a polyphenylene oxide and a phenol compound in the presence of a reaction initiator, and a hardening agent.

The phenol-modified polyphenylene oxide used in the epoxy resin composition can be obtained by subjecting a high molecular weight polyphenylene oxide having a number-average molecular weight of 10000 to 30000 to redistribution reaction to thereby reduce the number average molecular weight to 1000 to 4000. If the number-average molecular weight of the phenol-modified polyphenylene oxide is less than 1000, there is obtained an metal-clad laminate having deteriorated heat resistance properties, whereas, if more than 4000, there results a prepreg showing so high melting viscosity that there is a possibility that it is difficult to manufacture metal-clad laminates by an adhesion defect of the prepreg. A more preferred number average molecular weight of the phenol-modified polyphenylene oxide is 1000 to 3000.

The redistribution reaction (decomposition and rearrangement reaction) in the invention means a reaction to obtain a lower molecular weight polyphenylene oxide having a phenolic hydroxyl group at the end thereof by reacting a higher molecular weight polyphenylene oxide with a phenol compound in the presence of reaction initiator.

As the phenol compound to be used for the redistribution reaction, a phenol compound having at least two phenolic hydroxyl group are preferable, and there are illustrated bisphenols or novolak phenols.

In the case of using bisphenol A as the phenol compound, polyphenylene oxide and bisphenol A are heated to melt, then the reaction initiator is added thereto to cause redistribution reaction, as a result, phenol-modified polyphenylene oxide is obtained. As to the amount of bisphenol A, it is compounded suitably in an amount of 1 to 10 parts by weight per 100 parts by weight of polyphenylene oxide.

The reaction initiator to be used in the redistribution reaction is a compound which can be decomposed at the redistribution reaction to generate an alcohol. This alcohol evaporates at a temperature of 200° C. or less, and hence it scarcely remains in the final product. A boiling point of the alcohol is preferably 150° C. or less, more preferable 100° C. or less. As the alcohol, there are illustrated, for example, aliphatic alcohols.

When a reaction initiator that can be decomposed but does not generate an alcohol in the redistribution reaction (e.g., benzoyl peroxide) is used, the decomposed product upon the reaction generally has a high boiling point and is not easily evaporated when the epoxy resin composition is heated at a post-process. For example, the decomposed product of the benzoyl peroxide (i.e., benzoic acid) has a boiling point of approximately 249° C. Accordingly, in the hardening reaction of the epoxy resin composition, the decomposed product reacts with an epoxy group of the epoxy resin. As a result, the crosslinking property and reactivity of the epoxy resin deteriorate, and the crosslinking density decreases.

In contrast, when a reaction initiator that can be decomposed and generates an alcohol in the redistribution reaction is used as in the present invention, the alcohol is easily evaporated when the epoxy resin composition is heated at a post-process. As a result, the crosslinking property of the epoxy resin does not deteriorate, the reactivity of the epoxy resin is improved, and, the crosslinking density increases.

As the reaction initiator, a compound represented by the formula (1), a compound represented by the formula (2) and a compound represented by the formula (3) are preferably exemplified.

In the formula (1) to (3), a alkyl group of R, R', R¹ and R³ is preferably a alkyl group having from 1 to 12 carbon atoms, more preferably from 3 to 6 carbon atoms.

The redistribution reaction is preferably carried out in the presence of the reaction initiator and a catalyst. A specific example of the reaction initiator represented by the formula (2) is t-butyl peroxy isopropoyl monocarbonate represented by formula (4) below. In the case of using t-butyl peroxy isopropyl monocarbonate, there are produced, as by-products, t-butyl alcohol, isopropanol and carbon dioxide. However, since these compounds evaporate at a comparatively low temperature, they do not remain in the final product, thus less amounts of the unreacted materials remaining. Use of the phenol-modified polyphenylene oxide serves to improve reactivity of the epoxy resin composition and increase a glass transition temperature of an metal-clad laminate obtained by using the epoxy resin composition.

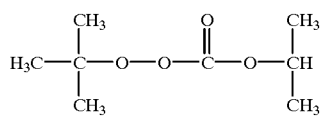

(4)

The reaction initiator is preferably compounded at the redistribution reaction in an amount of 1 to 10 parts by weight per 100 parts by weight of polyphenylene oxide.

As the catalyst to be used in the redistribution reaction, metal salts of an organic acid such as a naphthenic acid, a stearic acid and an acetic acid can be exemplified. Preferable examples of the metal include a Co, Mn and Zn. Preferable examples of the catalyst include manganese stearate, cobalt acetate and cobalt naphthenate. More preferable catalyst is cobalt naphthenate. This catalyst is compounded at the redistribution reaction in an amount of preferably 0.001 to 0.01 part by weight per 100 parts by weight of polyphenylene oxide.

In addition, polypenyhlene oxide modified with the novolak phenol as the phenol compound can be prepared by heating polyphenylene oxide and novolak phenol to melt, then adding thereto a reaction initiator to cause the redistribution reaction. As to the amount of the novolak phenol at the redistribution reaction, it is compounded in an amount of properly 5 to 10 parts by weight per 100 parts by weight of polyphenylene oxide. As the reaction initiator, the same one as described above may be used. The reaction initiator is used preferably in the same amount as described above.

The redistribution reaction for producing the modified polyphenylene oxides is conducted, for example, under the following conditions. That is, an organic solvent such as toluene, benzene or xylene is used, and the polyphenylene oxide, a phenol compound such as a bisphenol A and novolak phenol, and the reaction initiator are added to the solvent and heated at 80 to 100° C. for 10 to 100 minutes under stirring.

As the epoxy resin to be used in the epoxy resin composition, there may be used various epoxy resins used for preparing metal-clad laminates. For example, there are illustrated bisphenol A type epoxy resins, bisphenol F type epoxy resins, bisphenol S type epoxy resins, phenol novolak type epoxy resins, cresol novolak type epoxy resins, isocyanurate type epoxy resins, hydantoin type epoxy resins, alicyclic type epoxy resins, biphenyl type epoxy resins, multi-functional epoxy resins, and epoxy resins obtained by brominating these epoxy resins. The epoxy resin composition comprises the epoxy resin in an amount of preferably 40 to 70 parts by weight per 100 parts by weight of sum of the modified polyphenylene oxide and the epoxy resin.

As the hardening agent to be used in the epoxy resin composition, there are illustrated amine type hardening agents such as diaminodiphenylmethane, m-phenylenediamine, trilenediamine, ammonia, triethylamine and diethylamine. The epoxy resin composition comprises the hardening agent in an amount of preferably 1 to 5 part by weight per 100 parts by weight of sum of the modified polyphenylene oxide and the epoxy resin.

In order to accelerate hardening reaction, it is practical to add a hardening accelerator to the epoxy resin composition. As the hardening accelerator, there are illustrated, for example, imidazoles such as 2-methylimidazole, 2-ethyl-4-methylimidazole and 2-phenylimidazole, and tertiary amines such as 1,8-diaza-bicyclo[5.4.0]undecene-7, triethylenediamine and benzyldimethylamine. The epoxy resin composition comprises the hardening accelerator in an amount of preferably 0.1 to 1 part by weight per 100 parts by weight of sum of the modified polyphenylene oxide and the epoxy resin.

Next, the second embodiment of the epoxy resin composition of the invention is described below.

Descriptions are given with respect to only different points from the above-described epoxy resin composition. The epoxy resin composition comprises the phenol-modified polyphenylene oxide which is obtained by carrying out the redistribution reaction between polyphenylene oxide and a phenol compound in the presence of a reaction initiator and which has a number average molecular weight of 1000 to 4000, and the reaction initiator used in the redistribution reaction is a compound represented by the above formula (3). A specific reaction initiator represented by the formula (3) is exemplified by 1,1-bis(t-hexylperoxy)-3,3,5-trimethylcyclohexane represented by the following formula (5). When this 1,1-bis(t-hexylperoxy)-3,3,5-trimethylcyclohexane is used, 2-methyl-2-pentanol is generated. Since this 2-methyl-2-pentanol is an alcohol having a boiling point of 121° C. and evaporating at a comparatively low temperature, it does not remain in the final product, thus less amounts of unreacted ingredients remaining therein.

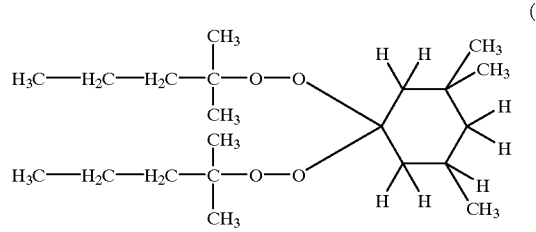

(5)

Use of the reaction initiator represented by the above formula (3) serves to improve the reactivity of the epoxy resin composition and increase a glass transition temperature of the metal-clad laminate using this epoxy resin composition.

As has been described hereinbefore, the epoxy resin composition of the invention contains the phenol-modified polyphenylene oxide obtained by the redistribution reaction in the presence of the particular reaction initiator, preferably the compound represented by the above formula (1), (2) or (3), and hence the epoxy resin composition shows a higher reactivity.

The prepreg of the invention is prepared by impregnating a substrate with an epoxy resin composition of the invention and semi-hardening the epoxy resin composition. As the substrate, there are illustrated glass substrates such as glass fiber cloth and glass unwoven cloth. The prepreg is obtained by, for example, dipping the substrate in the epoxy resin composition diluted with a solvent such as a toluene to impregnate, followed by heating to remove the solvent and semi-harden the epoxy resin composition by heating at a temperature of from 80° C. to 180° C. Amount of the resin for impregnating the substrate is not particularly limited, but it is preferred to impregnate the substrate so that the content of the resin after drying is 30 to 70% by weight based on the weight of the prepreg. The epoxy resin composition preferably maintains at a temperature of 25° C. to 50° C. when it impregnate the substrate in view of stability of impregnation and better property of the laminate. After the impregnation of the epoxy resin composition, a temperature for drying is preferably from 80° C. to 180° C.

The metal-clad laminate of the invention comprise a metal foil and a prepreg of the invention, in which the epoxy resin composition is hardened. In the metal-clad laminate of the invention, the epoxy resin composition in the prepreg is hardened by heat-pressing after the prepreg and the metal foil are superposed. For example, the predetermined number of the obtained prepreg(s) and the metal foil(s) such as a copper foil are superposed to prepare a material for being pressed, followed by heat-pressing the material to prepare the metal-clad laminate. The special examples of the metal foil include a cupper foil and an aluminum foil. A time and temperature for a crosslinking reaction of the modified polyphenylene oxide, the epoxy resin and the hardening agent can be conducted taking account of a kind of the hardening agent since those reaction conditions are dependent on reaction temperature of the hardening reagent mainly. The pressurization is carried out by adjusting adequately a pressure so that an air bubble does not remain in the metal-clad laminate obtained. The heat-pressing can be carried out under the conditions (temperature: 150° to 300° C., pressure: 1 to 6 MPa and time: 10 minutes to 120 minutes).

Since the metal-clad laminate is prepared from the epoxy resin composition containing the phenol-modified polyphenylene oxide obtained by using the specific reaction initiator, the metal-clad laminate has a better glass transition temperature and shows a lower expansion coefficient, a lower dielectric constant and a lower dielectric loss tangent.

The invention will be described in more detail by reference to examples which, however, are not construed as limiting the invention in any way.

Experiments for Investigating Redistribution Reaction using the Reaction Initiator and Number Average Molecular Weight In preparing phenol-modified polyphenylene oxides, the following investigation was conducted with respect to kind of the reaction initiator and number average molecular weight of the product obtained by the redistribution reaction. In the investigation, 36 parts by weight (hereinafter referred to as "parts") of polyphenylene oxide (number average molecular weight: 20000), 4 parts of bisphenol A, a predetermined amount (shown in Table 1) of the reaction initiator and 70 parts of toluene as a solvent were used, and the redistribution reaction was conducted at 90° C. for 90 minutes. As the reaction initiators, t-butyl peroxy isopropyl monocarbonate represented by the formula (4), 1,1-bis(t-hexylperoxy)-3,3,5-trimethylcyclohexane represented by the formula (5), 1,1-bis-(t-butylperoxy)-2-methylcyclohexane represented by the following formula (6), t-butyl peroxy benzoate represented by the following formula (7), dicumyl peroxide represented by the following formula (8), di-t-butyl peroxide represented by the following formula (9) and cumene hydroperoxide represented by the following formula (10) were used. Number average molecular weight of each reaction product was measured using gel permeation chromatography [HLC-8120; made by TOSOH Corporation]. In Table 1, the term "unreacted materials" means compounds having a number average molecular weight of 10,000 or more. The half-life decompostion temperature (the one hour half-life decomposition temperature) means a reaction temperature at which the reaction initiator is reduced to half upon a reaction for one hour.

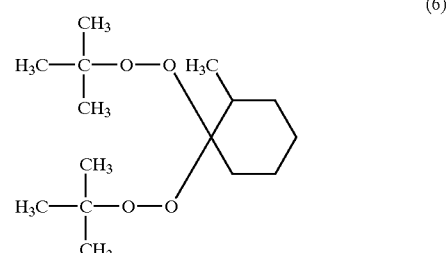

(6)

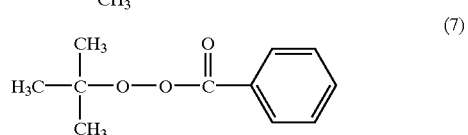

(7)

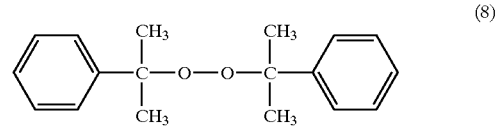

(8)

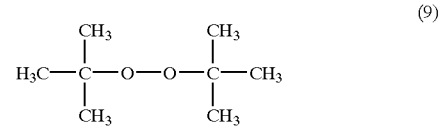

(9)

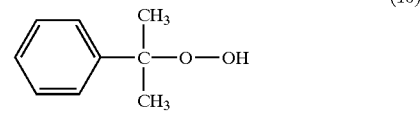

(10)

TABLE 1

| Kind of Reaction Initiator | Half-life decomposition temperature (one hour) | Molecular Weight | Amount of Reaction Initiator (part) | Number Average Molecular Weight | Ratio of Unreacted Materials | Note |
|---|---|---|---|---|---|---|
| Formula (4) | 118.4° C. | 176.2 | 1.1 | 1300 | 9 | 0.01 part of cobalt naphthenate was used as a catalyst |
| Formula (5) | 106.4° C. | 358.6 | 2.5 | 1320 | 12 | |
| Formula (6) | 102.4° C. | 274.4 | 1.9 | 1320 | 13 | |
| Formula (7) | 124.7° C. | 194.2 | 1.2 | 1320 | 40 | |
| Formula (8) | 135.7° C. | 270.4 | 1.7 | 10000 | scarcely reacted | |
| Formula (9) | 144.1° C. | 146.2 | 0.9 | 20000 | scarcely reacted | |

TABLE 1-continued

| Kind of Reaction Initiator | Half-life decomposition temperature (one hour) | Molecular Weight | Amount of Reaction Initiator (part) | Number Average Molecular Weight | Ratio of Unreacted Materials | Note |
|---|---|---|---|---|---|---|
| Formula (10) | 188.2° C. | 152.2 | 1.1 | 18000 | scarcely reacted | |

From the results above, it is seen that, in the case of conducting the redistribution reaction under the above-described reaction conditions using the initiators in amounts described above, t-butyl peroxy isopropyl monocarbonate represented by the formula (4), 1,1-bis(t-hexylperoxy)-3,3,5-trimethylcyclohexane represented by the formula (5), 1,1-bis (t-butylperoxy)-2-methylcyloxane represented by the formula (6) and t-butyl peroxy benzoate represented by the formula (7) are suitable as the reaction initiators. Especially, t-butyl peroxy isopropyl monocarbonate represented by the formula (4) and 1,1-bis(t-hexylperoxy)-3,3,5-trimethylcyclohexane represented by the formula (5) are preferred since by-products formed when they are used evaporate at a comparatively low temperature and controlling of molecular weight after the reaction is easy. Since the compounds represented by the formulas (8) to (10) have a high half-life decomposition temperature, they did not react under the reaction condition of this experiment. However, they can react if a reaction temperature and reaction time are increase.

Preparation of Metal-clad Laminates and Evaluation of their Properties

Advantages of the invention were confirmed by conducting Examples and Comparative Examples as follows.

EXAMPLE 1

First, a phenol-modified polyphenylene oxide was prepared. 100 parts of polyphenylene oxide [made by Nippon G.E. Plastic K.K.] (a number average molecular weight: 20,000) and 8 parts of bisphenol A [made by Mitsui Chemicals Inc.] were mixed and heated to melt, then 4 parts of t-butyl peroxy isopropyl monocarbonate [made by Nippon Yushi K.K.] represented by the formula (4) and 0.007 part of cobalt naphthenate [made by Nakaraitesuku K.K.] were added thereto as a reaction initiator represented by the formula (2) and a catalyst, respectively, followed by heating under stirring to cause redistribution reaction (reaction temperature: 90° C., reaction time: 90 minutes). Number average molecular weight of the reaction product was measured using a gel permeation chromatography [HLC-8120; made by Toso Co., Ltd.] to be 1900.

Then, 100 parts of the thus obtained phenol-modified polyphenylene oxide, 190 parts of a brominated novolak type epoxy resin [made by Nihon Kayaku K.K.; trade name: BREN-S], 3 parts of an amine compound [Etacure; made by Albemarle Co.] as a hardening agent, and 1 part of 2-ethyl-4-methylimidazole [made by Shikoku Kasei K.K.] as a hardening accelerator were compounded and stirred at room temperature for 30 minutes to obtain an epoxy resin composition.

EXAMPLE 2

Phenol-modified polyphenylene oxide was prepared in the following manner. 100 parts of polyphenylene oxide [made by Nippon G.E. Plastic K.K.] and 4 parts of bisphenol A [made by Mitsui Chemicals Inc. ] were compounded and heated to melt, then 3 parts of t-butyl peroxy isopropyl monocarbonate [made by Nippon Yushi K.K.] represented by the formula (4) and 0.007 part of cobalt naphthenate [made by Nakaraitesuku K.K.] were added thereto as a reaction initiator represented by the formula (2) and a catalyst, respectively, followed by heating under stirring to cause redistribution reaction. Number average molecular weight of the reaction product was 3260. An epoxy resin composition was obtained in the same manner as in Example 1 except for using the resultant phenol-modified polyphenylene oxide.

EXAMPLE 3

Phenol-modified polyphenylene oxide was prepared in the following manner. 100 parts of polyphenylene oxide [made by Nippon G.E. Plastic K.K.] and 4 parts of bisphenol A [made by Mitsui Chemicals Inc.] were compounded and heated to melt, then 10.5 parts of 1, 1-bis(t-hexylperoxy)-3,3,5-trimethycyclohexane [made by Nippon Yushi K.K.] represented by the formula (5) was added thereto as a reaction initiator represented by the formula (3), followed by heating under stirring to cause redistribution reaction. Number average molecular weight of the reaction product was measured using a gel permeation chromatography [HLC-8120 made by Toso Co., Ltd.] to be 2900. An epoxy resin composition was obtained in the same manner as in Example 1 except for using the resultant phenol-modified polyphenylene oxide.

Comparative Example 1

Phenol-modified polyphenylene oxide was prepared using benzoyl peroxide as a reaction initiator. 100 parts of polyphenylene oxide [made by Nippon G.E. Plastic K.K.] (a number average molecular weight: 20,000) and 4 parts of bisphenol A [made by Mitsui Chemicals Inc.] were compounded and heated to melt, then 4 parts of benzoyl peroxide (hereinafter abbreviated as "BPO") was added thereto, followed by heating under stirring to cause redistribution reaction (reaction temperature: 90° C., reaction time: 90 minutes). Number average molecular weight of the reaction product was measured using a gel permeation chromatography [HLC-8120 made by Toso Co., Ltd.] to be 3000. An epoxy resin composition was obtained in the same manner as in Example 1 except for using the resultant phenol-modified polyphenylene oxide.

Comparative Example 2

100 parts of polyphenylene oxide [made by Nippon G.E. Plastic K.K.] and 20 parts of bisphenol A [made by Mitsui Chemicals Inc.] were compounded and heated to melt, then 4.5 parts of t-butyl peroxy isopropyl monocarbonate [made by Nippon Yushi K.K.] represented by the formula (4) and 0.01 part of cobalt naphthenate [made by Nakaraitesuku K.K.] were added thereto as a reaction initiator represented by the formula (2) and a catalyst, respectively, followed by heating under stirring to cause redistribution reaction. Number average molecular weight of the reaction product was 890. An epoxy resin composition was obtained in the same manner as in Example 1 except for using the resultant phenol-modified polyphenylene oxide.

Comparative Example 3

100 parts of polyphenylene oxide [made by Nippon G.E. Plastic K.K.] and 1 part of bisphenol A [made by Mitsui Chemicals Inc.] were compounded and heated to melt, then 1.1 parts of t-butyl peroxy isopropyl monocarbonate [made by Nippon Yushi K.K.] represented by the formula (4) and 0.003 part of cobalt naphthenate [made by Nakaraitesuku K.K.] were added thereto as a reaction initiator represented by the formula (2) and a catalyst, respectively, followed by heating under stirring to cause redistribution reaction. Number average molecular weight of the reaction product was 8600. An epoxy resin composition was obtained in the same manner as in Example 1 except for using the resultant phenol-modified polyphenylene oxide.

Evaluation

Prepregs and metal-clad laminates for evaluation were prepared using the epoxy resin compositions of Examples 1 to 3 and Comparative Examples 1 to 3. The thus obtained epoxy resin compositions were impregnated into 0.1-mm thick glass fiber cloth [made by Asahi Shueber K.K.; trade name: 2116L], and dried at 150° C. for 6 minutes to obtain prepregs having a resin content of 43% by weight. 8 sheets of the prepreg were superposed one over the other, and a 18-μm thick copper foil [made by Nikko Gould Foil K.K.; trade name: JTC] was disposed on both sides of the superposed prepregs to prepare an assembly for being pressed, followed by heating the assembly under pressure for 100 minutes under the conditions of 200° C. in temperature and 2 MPa in pressure. Thus, there were produced 0.75- to 0.80-mm thick metal-clad laminates wherein copper foil was adhered to both sides.

When heated under pressure, the assembly using the prepregs obtained in Comparative Example 3 suffered adhesion failure, and hence no metal-clad laminates were produced in this case.

Reactivity were measured using respective prepregs. The reactivity was measured by collecting resin powder dropped from the prepreg, heating it at 200° C. for 2 hours to harden, pulverizing the hardened product, then extracting the pulverized product with hot chloroform. The reactivity was calculated based on the amounts of the extracts.

Thermal expansion coefficient ($\alpha$) and glass transition temperature (Tg) of the metal-clad laminates obtained in Examples 1 to 3 and Comparative Examples 1 and 2 were measured. Measurement of thermal expansion coefficient ($\alpha$) and glass transition temperature (Tg) was carried out according to JIS-C 6481. As to the thermal expansion coefficient ($\alpha$), coefficient of linear expansion in the direction of thickness (Z direction) was measured using TMA (TAS100; made by Rigaku K.K.). In measuring, coefficient of linear expansion was measured under the conditions of 0.005 N in load, 5° C./min in temperature-raising rate and 25° C. to 250° C. in temperature to obtain a chart of coefficient of linear expansion, from which average coefficient of linear expansion between 75 to 125° C. was calculated. The glass transition temperature was determined from the inflection point of the above-described chart of coefficient of linear expansion.

In addition, specific dielectric constant, dielectric loss tangent and heat resistance of the metal-clad laminates obtained in Examples 1 and 2 and Comparative Examples 1 and 2 were measured. Specific dielectric coefficient and dielectric loss tangent were measured according to JIS-C-6481. As to heat resistance, the metal-clad laminates were left in a 250° C. or 260° C. oven for 30 minutes, followed by visually checking for abnormality such as blister. Metal-clad laminates with no abnormality were rated as A, and metal-clad laminates forming blister or the like were rated as B.

TABLE 2

| Reaction initiator | Example 1 Formula (4) | Example 2 Formula (4) | Example 3 Formula (5) | Com. Ex. 1 BPO | Com. Ex. 2 Formula (4) | Com. Ex. 3 Formula (4) |
|---|---|---|---|---|---|---|
| Number average molecular weight | 1900 | 3260 | 2900 | 3000 | 890 | 8600 |
| Reactivity (%) | 98 | 97 | 98 | 96 | 93 | 72 |
| Tg (° C.) | 172 | 175 | 170 | 160 | 160 | — |
| $\alpha$(ppm) | 58 | 62 | 60 | 62 | 67 | — |
| Specific dielectric coefficient (1 MHz) | 3.75 | 3.73 | — | 3.95 | 3.85 | — |
| Dielectric loss tangent (1 MHz) | 0.0057 | 0.0050 | — | 0.0090 | 0.0065 | — |
| Heat resistance at 250° C. | A | A | — | A | B | — |
| Heat resistance at 260° C. | A | B | — | A | B | — |

Formula (4): t-butyl peroxy isopropyl monocarbonate
Formula (5): 1-Bis(t-hexylperoxy)-3,3,5-trimethylcyclo-hexane Results are as shown in Table 2. Reactivity in Examples are all higher than that in Comparative Examples. All of the metal-clad laminates obtained in Examples show better thermal expansion coefficients ($\alpha$) and better glass transition temperature (Tg) than those of the metal-clad laminates obtained in Comparative Examples. In addition, the metal-clad laminates obtained in Examples 1 and 2 show lower dielectric properties than the metal-clad laminates obtained in Comparative Examples 1 and 2.

The epoxy resin composition of the invention uses a phenol-modified polyphenylene oxide prepared by redistribution reaction in the presence of a specific reaction initiator, and hence a high reactivity is attained. In addition, this epoxy resin composition provides metal-clad laminates having a better glass transition temperature, a lower expansion coefficient and lower dielectric properties.

The prepreg of the invention is prepared from the epoxy resin composition containing as a constituent a phenol-modified polyphenylene oxide prepared by redistribution reaction in the presence of a specific reaction initiator, and hence it enables one to obtain metal-clad laminates having a better glass transition temperature, a lower expansion coefficient and lower dielectric properties.

The metal-clad laminate of the invention uses prepreg prepared from the epoxy resin composition containing as a constituent a phenol-modified polyphenylene oxide prepared by redistribution reaction in the presence of a specific reaction initiator, and hence it has a better glass transition temperature, a lower expansion coefficient and lower dielectric properties.

While the invention has been described in detail and with reference to specific embodiments thereof, it will be apparent to one skilled in the art that various changes and modifications can be made therein without departing from the spirit and scope thereof.

What is claimed is:

1. An epoxy resin composition comprising:

an epoxy resin;

an amine-type hardening agent in an amount of 1 to 5 parts by weight per 100 parts by weight of a sum of the modified polyphenylene oxide and the epoxy resin; and a phenol-modified polyphenylene oxide having a number average molecular weight of 1000 to 4000, which is prepared by carrying out a redistribution reaction between a polyphenylene oxide and a phenol compound in the presence of a reaction initiator which can be decomposed to generate an alcohol.

2. The epoxy resin composition as described in claim 1, wherein the alcohol is an aliphatic alcohol.

3. The epoxy resin composition as described in claim 1, wherein the alcohol has a boiling point of 150° C. or less.

4. The epoxy resin composition as described in claim 1, wherein the reaction initiator is a compound represented by formula (1):

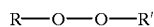

(1)

wherein R and R', which are the same or different, each represents an alkyl group.

5. The epoxy resin composition as described in claim 1, wherein the reaction initiator is a compound represented by formula (2):

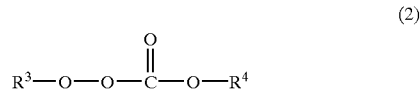

(2)

wherein $R^3$ and $R^4$, which are the same or different, each represents an alkyl group.

6. The epoxy resin composition as described in claim 5, wherein the reaction initiator represented by the formula (2) is t-butyl peroxy isopropyl monocarbonate.

7. The epoxy resin composition as described in claim 1, wherein the reaction initiator is a compound represented by formula (3):

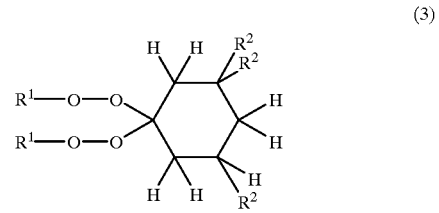

(3)

wherein $R^1$ represents an alkyl group, $R^2$ represents $CH_3$ or H.

8. The epoxy resin composition as described in claim 1, wherein the redistribution reaction is carried out in the presence of a catalyst together with the reaction initiator.

9. The epoxy resin composition as described in claim 8, wherein the catalyst is cobalt naphthenate.

10. The epoxy resin composition as described in claim 8, wherein the catalyst is compounded in an amount of 0.001 to 0.01 part by weight per 100 parts by weight of the polyphenylene oxide.

11. A prepreg prepared by: impregnating a substrate with an epoxy resin composition described in claim 1; and semi-hardening the epoxy resin composition.

12. A metal-clad laminate comprising a metal foil and a prepreg described in claim 11, in which the epoxy resin composition is hardened.

13. The epoxy resin composition of claim 1, wherein the hardening agent comprises at least one of diaminodiphenylmethane, m-phenylenediamine, trilenediamine, ammonia, triethylamine, and diethylamine.

* * * * *